(12) United States Patent
Yahiro

(10) Patent No.: US 6,476,655 B2
(45) Date of Patent: Nov. 5, 2002

(54) SEMICONDUCTOR DEVICE

(75) Inventor: Katsumi Yahiro, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/846,251

(22) Filed: May 2, 2001

(65) Prior Publication Data

US 2001/0053195 A1 Dec. 20, 2001

(30) Foreign Application Priority Data

May 30, 2000 (JP) ........................................ 2000-159423

(51) Int. Cl.[7] ................................................ H03K 3/84
(52) U.S. Cl. ...................................... 327/172; 327/164
(58) Field of Search ............................... 327/172, 175, 327/261, 263, 265, 279, 164

(56) References Cited

U.S. PATENT DOCUMENTS 6,072,347 A * 6/2000 Sim ........................... 327/279

FOREIGN PATENT DOCUMENTS

| JP | 404346083 A | * 12/1992 | ................. 327/265 |
| JP | 11-220365 | 8/1999 | |

* cited by examiner

Primary Examiner—Dinh T. Le
(74) Attorney, Agent, or Firm—McGinn & Gibb, PLLC

(57) ABSTRACT

A semiconductor device according to the invention is composed of a counter which outputs intermediate carry signals (CARRY 0, 1, 2) and the final carry signal (CARRY END) for determining the end of a delay output signal in a period starting from a delay pulse-generating trigger signal (DPT) and continuing for a predetermined time, and a delay circuit which outputs count up signals (COUNT UP) for counting up the counter on the basis of pulse signals generated in accordance with the intermediate carry signals and the DPT. According to the aforementioned semiconductor device, the delay output signal can be outputted without using an external clock signal.

20 Claims, 7 Drawing Sheets

SEMICONDUCTOR DEVICE

FIELD OF THE INVENTION

The invention relates to a semiconductor device, and especially to a semiconductor device provided with a memory circuit, a sense amplifier, and a delay circuit section which sets an activation period of a sense amplifier and outputs a delay output signal having a wide pulse width without using an external circuit.

BACKGROUND OF THE INVENTION

A semiconductor memory is composed of a memory circuit formed of semiconductor, a sense amplifier and a delay circuit section. When a data is read from a memory circuit, it is necessary to activate the sense amplifier at the time suited for characteristic and specification of a semiconductor device, and an operation of the sense amplifier is controlled by an output signal of the delay circuit section. A width of the output signal (a pulse width is determined by the delay circuit section. As methods for determining the width of the output pulse of the delay circuit section, flowing ones can be enumerated.

(i) The number of stages of delay elements is increased or decreased.

(ii) N-channel transistors of a depletion type (capative depletion transistors) are adopted, potentials of sources and drains are at the ground potential level, gates are respectively connected with a signal line, and dimensions of the transistors having gate capacitors are increased or decreased.

Although a pulse width of the delay circuit is 50 ns to 100 ns in general, it sometimes occurs that a wide pulse width of 200 ns to 1 ms is required because of specification of a product.

FIG. 1 shows a conventional semiconductor device disclosed in Japanese Patent Applications, Laid-Open, No. 11-220365, in which the pulse width is adjusted by means of a counter.

The semiconductor device is composed of an expected value-generating circuit 70, a counter 71, a comparator 72, a delay-control circuit 73, a delay line 74 and an invertor 75.

The expected value-generating circuit 70 generates an expected value of the number of pulse signals of an output clock signal 17 per a period of an input clock signal 16, and the counter 71 counts the number of the pulses of an output clock signal 17. The comparator 72 compares a counted data of the counter 71 with the expected value outputted from the expected value-generating circuit 70. The delay-control circuit 73 controls a value a delay on the basis of an information supplied from the comparator 72. The delay line 74 changes the value of the delay in accordance with plural control signal Sd supplied from the delay-control circuit 73. A ring oscillator is constituted by the delay line 74 and the invertor 75.

Next, an operation of the structure shown in FIG. 1 will be explained. The counter 71 counts the number of the pulses of the output clock signal 17 in a period of the input clock signal 16. The expected value-generating circuit 70 generates a counted data of an ideal output clock signal 17 in a period of the input clock signal 16, and inputs it to the comparator 72 as the expected value. For example, in case that an output clock signal 17 of 32 Mhz is desired to be derived from the input clock signal 16 of 32 khz, an expected value of 1000 is generated in a binary data, where 1000 is obtained from a relation that $(1/32000)/(1/32000000)=1000.$ The comparator 72 compares the counted data of the counter 71 with the expected value generated by the expected value-generating circuit 70 every period of the input clock signal 16. The comparator 72 outputs a DOWN signal when the expected value is larger, and an UP signal when the expected value is smaller. When the expected value is equal to the counted data, both the DOWN and UP signals are not outputted. When a comparison has been made in, the comparator 72, the counter 71 is reset at once, and a next count is restarted. The delay control circuit 73 outputs n delay-control signals Sd for controlling a delay time of the delay line 74 in accordance with the UP or DOWN signal generated by the comparator 72.

When the UP signal is outputted from the comparator 72, the number of signals at the state of "1" in the delay-control signal Sd outputted from the delay-control circuit 73 is increased by one, and thereby the frequency of the output clock signal 17 of the ring oscillator is lowered. As a result, in a comparison made in the next period of the input clock signal 16, the counted data of the counter 71 becomes smaller than that in the preceding period. If the expected value is smaller than the counted data of the counter 71 in a comparison made in the comparator 72, the UP signal is again outputted and the number of the signals at the state of "1" in the plural delay-control signals Sd is further increased by one. If such processes are repeated, the expected value coincides with the counted data of the counter 71 finally.

On the other hand, if the expected value is larger than the counted data of the counter 71 as a result of a comparison made in the comparator 72, the DOWN signal is outputted from the comparator 72. When the DOWN signals is outputted, the frequency of the output clock signal of the ring oscillator is heightened by decreasing the number of the signals at the state of "1" in the delay control signals Sd by one. As a result, in the comparison made in the next period of the input clock signal 16, the counted data of the counter 71 becomes larger than that in the preceding period of the same. If the expected value is still larger than the counted data of the counter 71 as the result of comparison again made in the comparator 72, the DOWN signal is further outputted, and the number of the signals at the state of "1" in the delay control signals Sd is further decreased by one. If such processes are repeated, the expected value coincides with the counted data of the counter in a short time.

However, in the aforementioned conventional semiconductor device, the clock signal is supplied from the outside, and the delay circuit section functions on the basis of the external clock signal. That is to say, even in the semiconductor device which necessitates an inside lock signal and does not necessitate the external clock signal, it becomes necessary to supply the external clock signal to the semiconductor device, and restriction is imposed on a design of the semiconductor device.

Moreover, if becomes necessary to generate such a wide pulse as one having a width of 1 ms in accordance with specification of a user, the number of transistors for constituting the delay elements becomes more than ten times as larger as that of the ordinary semiconductor device, and areas of chips are enlarged.

SUMMARY OF THE INVENTION

Accordingly, it is an object of the invention to provide a semiconductor device in which a delay output signal or a pulse signal can be outputted without using an external clock signal, and a pulse-generating circuit can be constituted without enlarging a scale of a circuit even if an extremely wide pulse is desired.

According to the first feature of the invention, the semiconductor device comprises:

a counter which outputs plural pulse signals in a period starting from a trigger signal and continuing for a predetermined time and generate a signal for determining an end of a delay output signal on a basis of a composed signal derived by processing the plural pulse signals, and a delay circuit which outputs count up signals for counting up the counter on a basis of the plural pulse signals inputted from the counter and the trigger signal.

According the aforementioned structure, when the count up signals outputted from the delay circuit are inputted to the counter, the counter outputs the pulse signal for determining the end of the delay output signal as well as the plural pulse signals for setting the delay times. The plural pulse signals outputted from the counter are inputted to the delay circuit as the signals for setting the delay times, and the count up signals are generated. Since the pulse signals for setting the delay times are generated in the inside, it becomes unnecessary to supply a clock signal from the countside, and restriction imposed on a design is removed. Moreover, since a pulse signal having a desired width can be generated without increasing the number of the delay elements, areas of chips are not enlarged.

According to the second feature of the invention, the semiconductor device comprises:

a first counter which outputs first plural pulse signals in a period starting from a trigger signal and continuing for a predetermined time and generates first composed signals derived by processing the first plural pulse signals, a second counter which outputs second plural pulse signals synchronizing with the first composed signals and generates a second composed signal for determining an end of a delay output signal which is derived by processing the second plural pulse signals, and a delay circuit which outputs count up signals for counting up the first counter on a basis of input pulse signals synchronizing with the first and second plural pulse signals respectively outputted from the first and second counters and the trigger signal.

According to the aforementioned structure, when the count up signals outputted form the delay circuit are inputted to the first counter, the first counter outputs the plural pulse signals and the signals for counting up the second counter. The second counter outputs the plural pulse signals for setting the delay times, and a single pulse signal for determining the end of the delay output signal. The plural pulse signals outputted from the first and second counters are inputted to the delay circuit as the pulse signals for setting the delay times, and thereby the count up signals are generated. Since the pulse signals for setting the delay times are generated in the inside, it becomes unnecessary to supply the clock signal from the outside, and restriction imposed on a design is removed. Moreover, since a pulse signal with a desired width can be generated without increasing the number of the delay elements, areas of chips are not enlarged.

BRIEF DESCRIPTION OF THE DRAWINGS

The invention will be explained in more detail in conjunction with appended drawings, wherein.

DESCRIPTION OF THE PREFERRED EMBODIMENTS

Hereafter, embodiments of the invention will be explained referring to the appended drawings.

Figure 1:
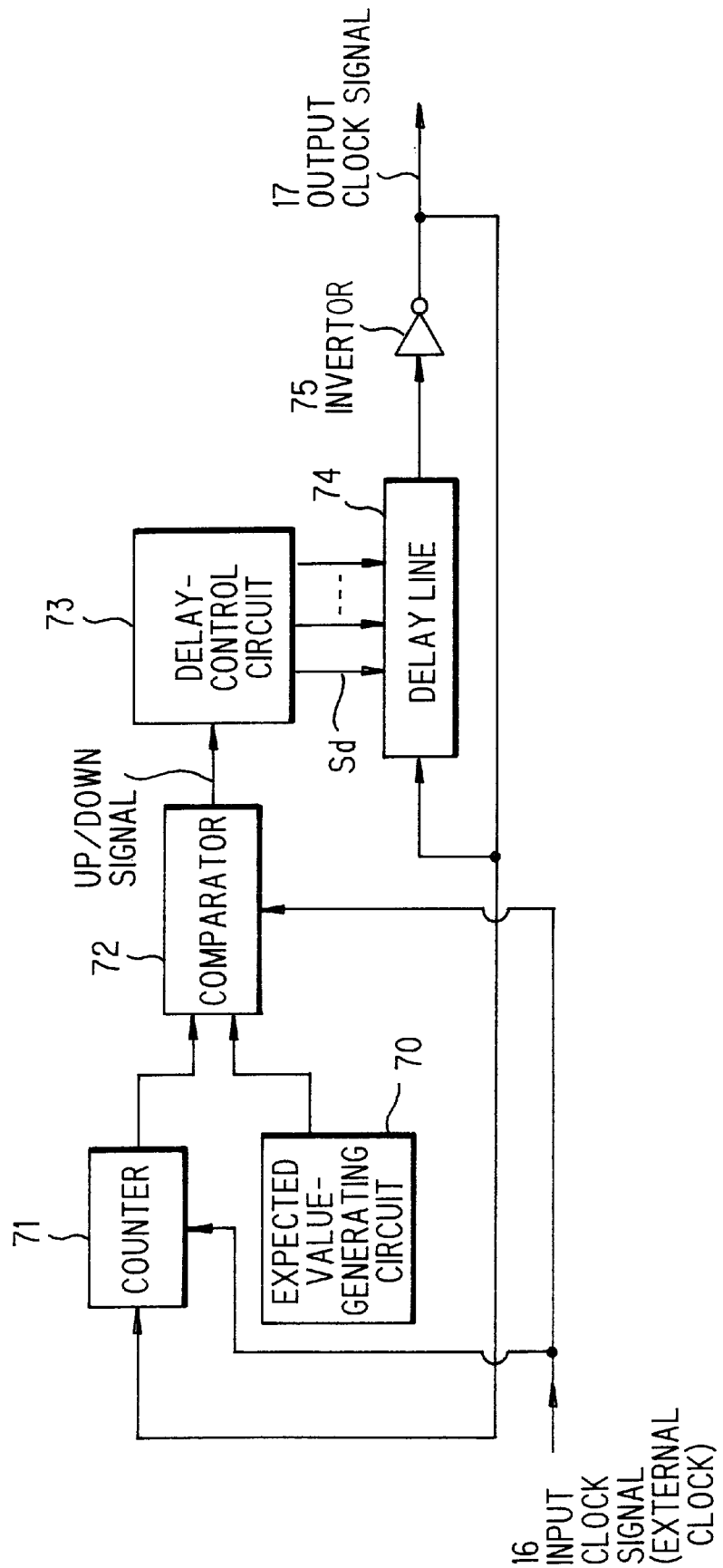
FIG. 1 is a block diagram for showing a structure of a conventional semiconductor device.
Figure 2:
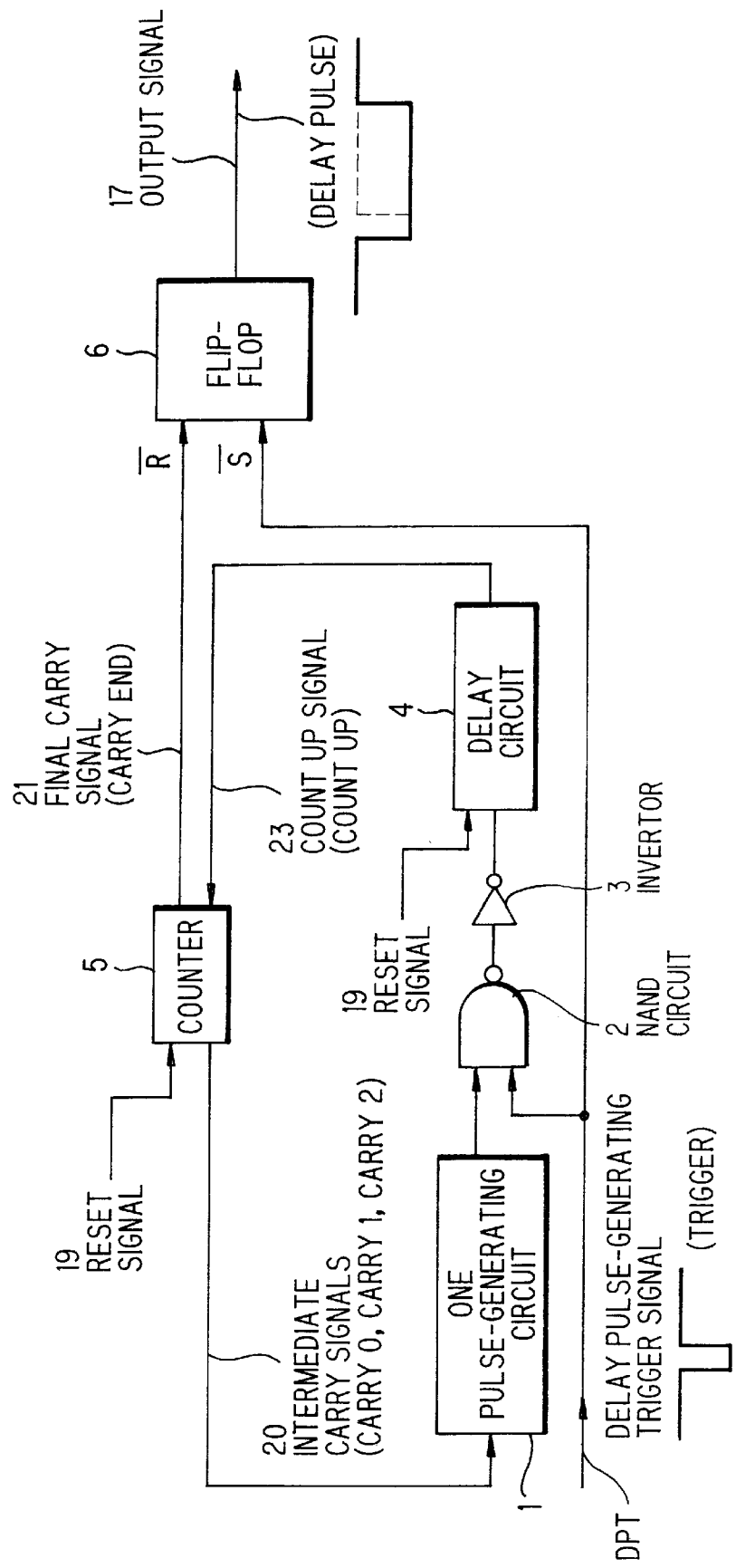
FIG. 2 is a block diagram for showing a structure of a main part of a semiconductor device according to the first preferred embodiment of the invention.

FIG. 2 shows a semiconductor device according to the first preferred embodiment of the invention. Herein, only a delay circuit section is shown, and the other parts of the semiconductor device are omitted.

The delay circuit section is composed of a one pulse-generating circuit 1, a NAND circuit 2, an invertor 3, a delay circuit 4, a counter 5 and a flip-flop 6. A delay pulse-generating trigger signal (TRIGGER) DPT is inputted to the flip-flop 6 and the NAND circuit 2. An output terminal of the one pulse-generating circuit 1 is connected with one of input terminals of the NAND circuit 2. An output of the NAND circuit 2 is connected with the delay circuit 4 via the invertor 3. An output signal of the delay circuit 4 is inputted to the counter 5 as a count up signal (COUNT UP) 23.

When the counter 5 is counted up, the counter 5 outputs intermediate carry signals (CARRY 1, 2, 3) corresponding to plural pulse signals, and a final carry signal (CARRY END) 21. The intermediate carry signals 20 are inputted to the one pulse-generating circuit 1, and the final carry signal 21 is inputted to the flip-flop 6. The one pulse-generating circuit 1 outputs a one pulse, which is inputted to the NAND circuit 2 and the delay circuit 4 via the invertor 3. The flip-flop 6 is set (S bar) by the delay pulse-generating trigger signal DPT, and reset (R bar) by the final carry signal 21. Thereby, a pulse is composed, and an output pulse signal 17 is generated. As a result, a width of the pulse outputted from the delay circuit 4 becomes a desired value.

Next, an outline of an operation of the structure shown in FIG. 2 will be explained.

The delay pulse-generating trigger signal DPT is inputted to the delay circuit 4 via the NAND circuit 2 and the invertor 3. The delay circuit 4 widens the width of the pulse by delaying rise of the pulse. The pulse signal outputted from the delay circuit 4 is supplied to the counter 5, which is counted up. The output signals of the counter 5 are supplied to the one pulse-generating circuit 1 as the intermediate carry signals 20. Moreover, the final carry signal 21 is supplied to the flip-flop 6 as the reset signal. When the intermediate carry signals 20 are inputted to the one pulse-generating circuit 1, the one pulse-generating circuit 1 generates the one pulse (the low logical level) every time the input signal rises, and this pulse signal is returned to the delay circuit 4 via the NAND circuit 2 and the invertor 3.

Moreover, the flip-flop 6 is set by the delay pulse-generating trigger signal DPT, and reset by the final carry signal 21 supplied from the counter 5, and thereby the pulse is composed.

Figure 3:
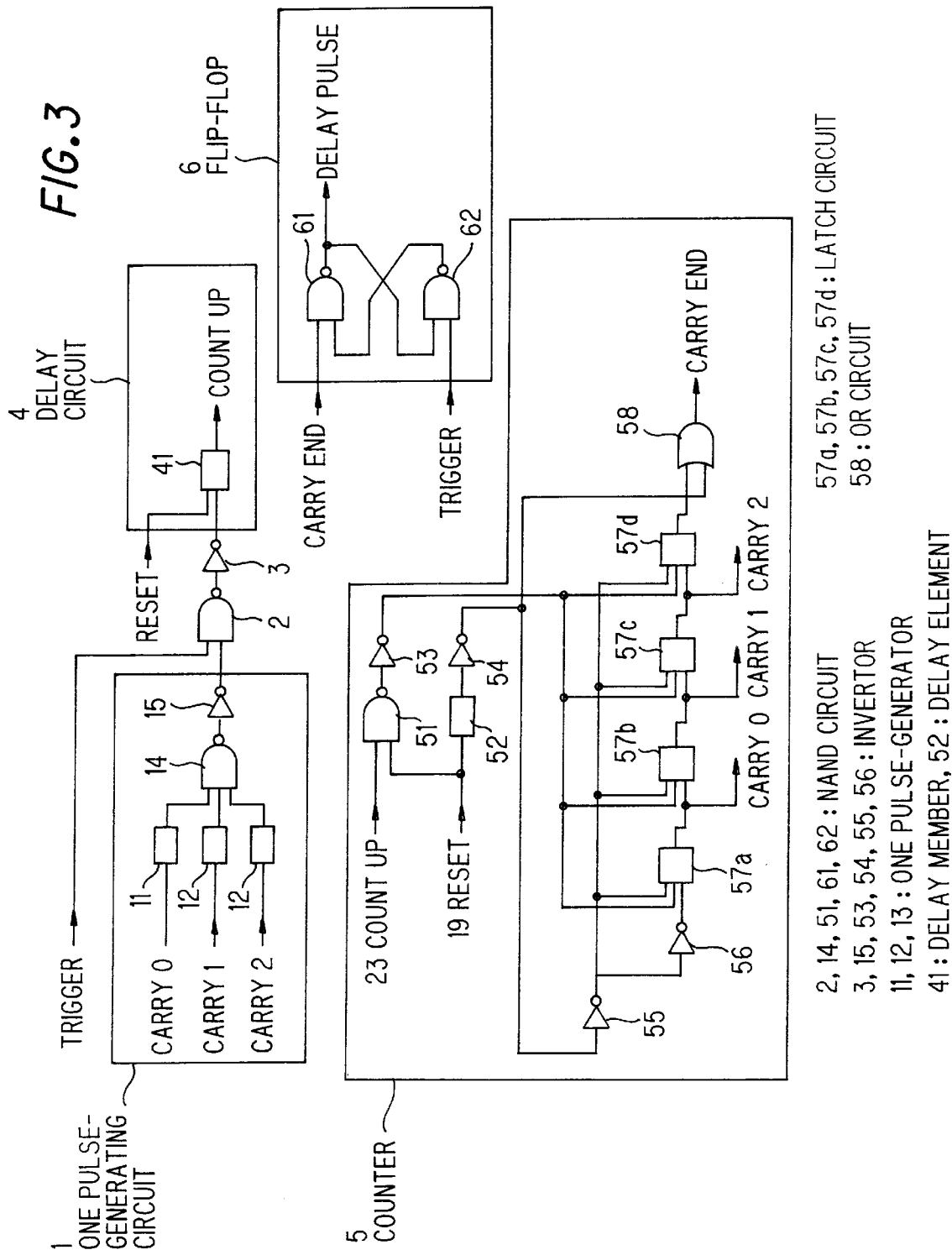
FIG. 3 shows a detailed structure of a semiconductor device shown in FIG. 2.

FIG. 3 shows the semiconductor device shown in FIG. 2 in detail.

The one pulse-generating circuit 1 is composed of one pulse-generators 11, 12, 13, a NAND gate 14 and an invertor 15. The one pulse-generators 11, 12, 13 are respectively supplied with the intermediate carry signals (CARRY 0, 1, 2) 20. The delay circuit 4 is formed of a delay member 41, and the NAND circuit 2 and the invertor 3 are inserted between the one pulse-generating circuit 1 and the delay circuit 4. The delay member 41 is composed of delay elements of a transistor type, which is suited for being constituted as an IC circuit.

The counter 5 is composed of a NAND circuit 51 supplied with the count up signal (COUNT UP) 23, an invertor 53 for inverting an output signal of the NAND circuit 51, an invertor 54 for inverting an output signal of a delay element 52, an invertor 55 for inverting an output signal of the invertor 54, an invertor 56 for inverting an output signal of the invertor 55, latch circuits 57a to 57d, and an OR circuit 58 supplied with output signals of the latch circuit 57d and the invertor 54. The latch circuit 57a is supplied with the output signals of the invertor 56 and the invertor 53, the latch circuit 57b is supplied with the output signals of the latch circuit 57a and the invertor 53, the latch circuit 57c is supplied with the output signals of the latch circuit 57b and the invertor 53, and the latch circuit 57d is supplied with the output signals of the latch circuit 57c and the invertor 53. Moreover, the flip-flop 6 is composed of the NAND circuits 61, 62.

In FIG. 3, at the time that the delay pulse-generating trigger signal DPT is inputted to the delay circuit 4 via the NAND circuit 2 and the invertor 3, a reset signal 19 is inputted to the respective latch circuits 57a to 57d. The output signal (COUNT UP) 23 of the delay circuit 4 is inputted to the invertor 53 of the counter 5 as the count up signal. The intermediate carry signals (CARRY 0, 1, 2) 20 are respectively inputted to the one pulse-generators 11, 12, 13 in the one pulse-generating circuit 1. Whenever CARRY 0, 1, 2 change from the low logical level to the high logical level, the one pulse-generators 11, 12, 13 generates output signals respectively, and the one pulse signals obtained through a NAND circuit 14 are inputted to the delay circuit 4 via the NAND circuit 2 and the invertor 3 similarly to the delay pulse generating signal DPT.

Although the latch circuits 57a to 57d operate always in the system shown in FIG. 3, if the system is so constructed that the number of the latch circuits to be used can be selected in a range one to four, the delay times of plural kinds can be obtained. In this case, it is necessary to so construct the system that the logic of an input circuit of the NAND circuit 14 of the one pulse-generating circuit 1 is met independently of the number of the selected latch circuits.

Figure 4:
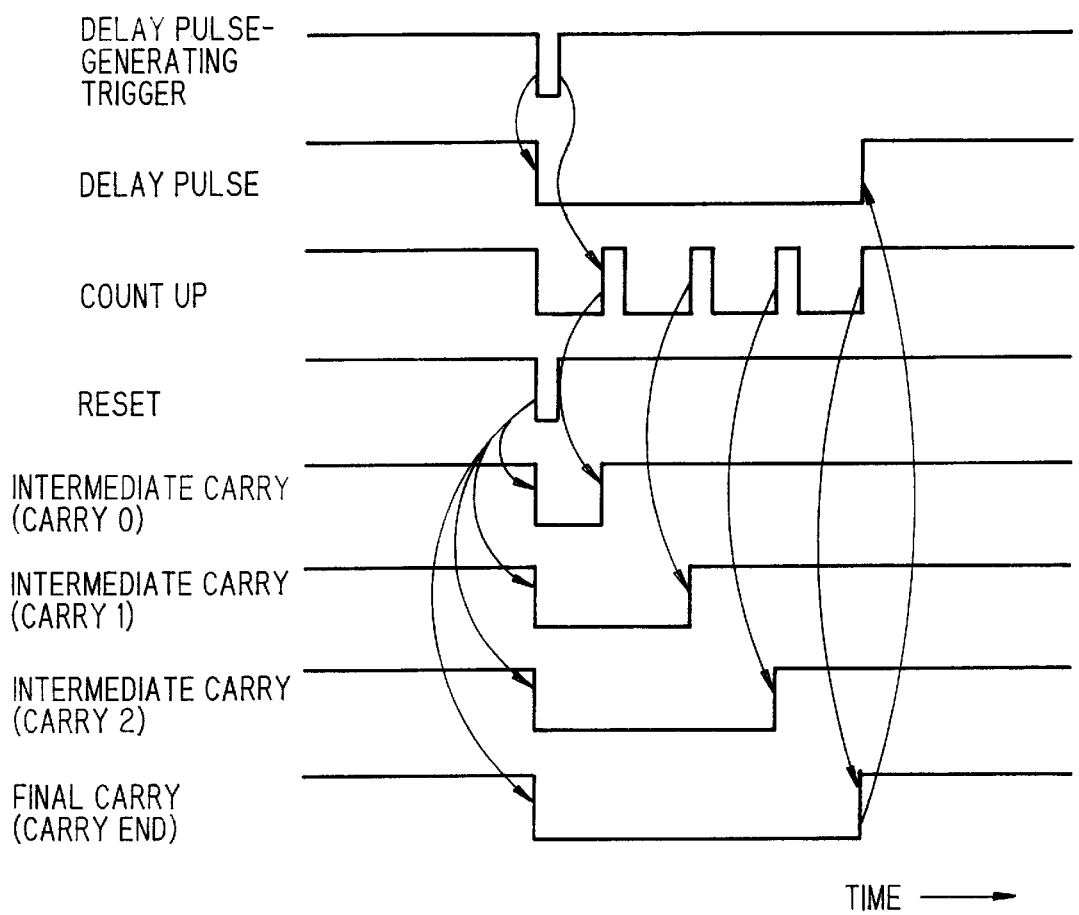
FIG. 4 is a timing chart for showing operations of various parts of the semiconductor device according to the first preferred embodiment of the invention.

FIG. 4 shows operations of various parts of the semiconductor device according to the first preferred embodiment of the invention. The operation of the semiconductor device will be explained referring to FIGS. 2 to 4.

When the delay pulse-generating trigger signal DPT changes from the high logical level to the low logical level, the flip-flop 6 is set, and an output of a composed pulse (DELAY PULSE) 17 starts. When the final carry signal (CARRY END) 21 changes from the low logical level to the high logical level, the flip-flop 6 is reset, and the output signal 17 is shut off. The one pulse-generating circuit 1 outputs a pulse with a narrow width (the one pulse) when one of the carry signals (CARRY 0, 1, 2) 20 changes from the low logical level to the high logical level. The delay circuit 4 operates in accordance with the one pulse signal inputted from the one pulse-generating circuit 1. Explaining concretely, the delay circuit 4 does not delay the input signal when the one pulse signal changes from the high logical level to the low logical level, and delays the input signal only when the one pulse signal changes from the low logical level to the high logical level. Thereby, the count up signal (COUNT UP) 23 shaped into a desired pulse width is outputted from the delay circuit 4.

In the counter 5, when the reset signal 19 is inputted via the delay element 52 and the invertors 54, 55, 56, the latch circuits 57a to 57d are reset. When the latch circuits 57a to 57d are reset, the intermediate carry signals (CARRY 0, 1, 2) 20 and the final carry signal 21 are reset to the low logical level simultaneously. Next, when the count up signal (COUNT UP) 23 changes from the low logical level to the high logical level, the latch circuit 57a takes in a signal at the high logical level, and CARRY 0 in the intermediate signals 20 changes from the low logical level to the high logical level. When the count up proceeds and the count up signal (COUNT UP) 23 changes from the low logical level to the high logical level, since the latch circuit 57b takes in a signal at the high logical level, CARRY 1 in the intermediate carry signals 20 changes from the low logical level to the high logical level. When the count up is further repeated, the final carry signal 21 changes from the low logical level to the high logical level. Since the final carry signal 21 is impressed upon the flip-flop 6, the flip-flop 6 outputs DELAY PLUSE (the output signal 17)

Figure 5:
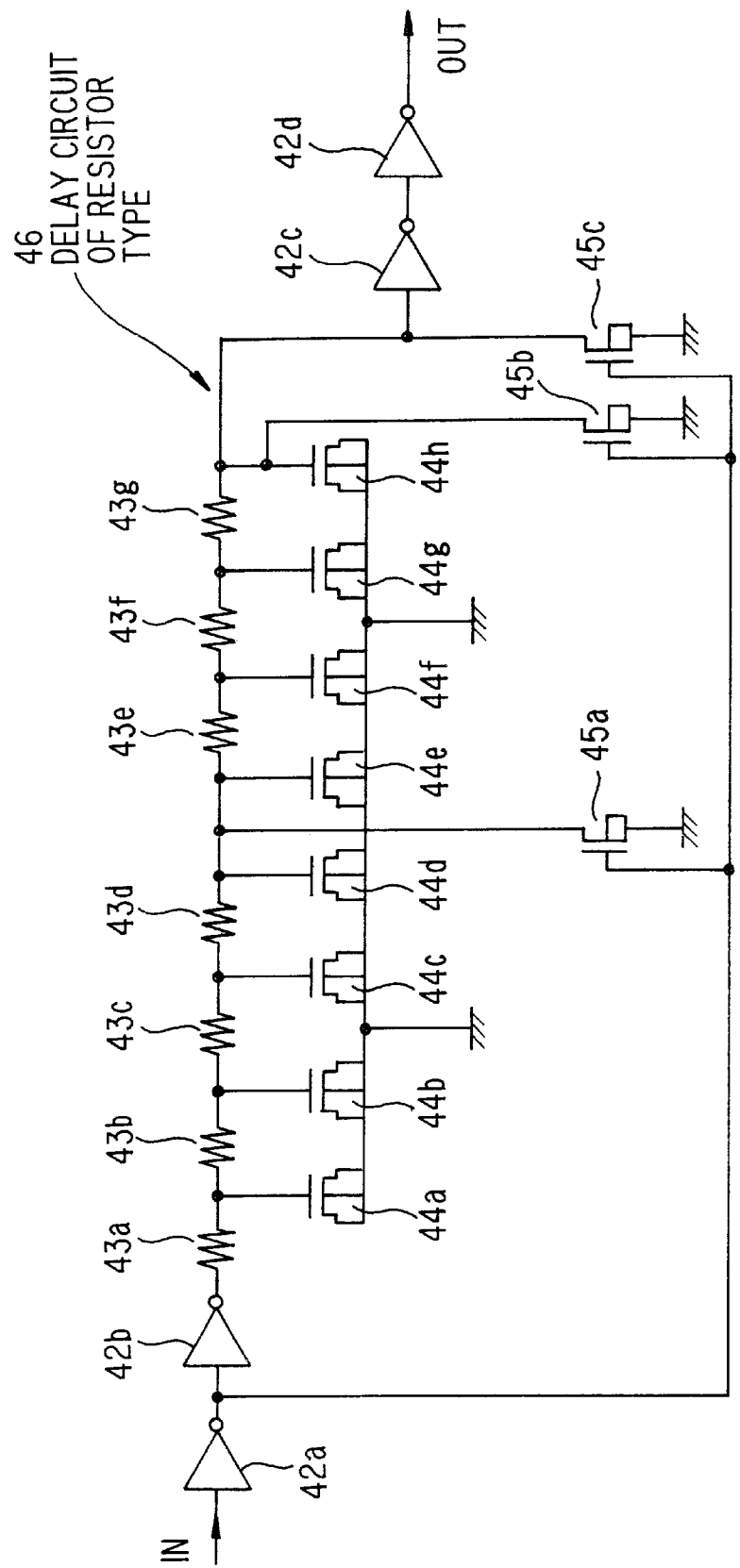
FIG. 5 is a circuit diagram for showing a delay circuit according to the second preferred embodiment of the invention.

FIG. 5 shows the second preferred embodiment of the invention.

In this embodiment, the delay member 41 of the delay circuit 4 shown in FIG. 3 is replaced with a delay circuit of a resistor type 46. As shown in FIG. 5, the delay circuit of the resistor type 46 is composed of invertors 42a, 42b, 42c, 42d, resistors connected in series 43a, 43b, 43c, 43d, 43e, 43f, 43g, capacitive depletion transistors connected with junction points between the adjacent resistors and an output end of the final resistor 44a, 44b, 44c, 44d, 44e, 44f, 44g, 44h and N-type MOS transistors 45a, 45b, 45c.

The invertor 42a inverts an input signal (the output of the invertor 3), and the invertor 42b inverts an output signal of the invetor 42a. Gates of the capacitive depletion transistors 44a to 44h are respectively connected with output ends of the resistors 43a to 43g, and sources and drains of the same are respectively jointed and commonly connected with the ground. In the aforementioned circuit, the capacitive depletion transistors 44a to 44h respectively constitute capacitive components of a RC integrator. A drain and a source of the N-type MOS transistor 45a are respectively connected with the output end of the resistor 43d and the ground, and a gate thereof is connected with an output terminal of the invertor 42. The N-type MOS transistors 45b, 45c are inserted between the output end of the resistor 43g and the ground in a condition that their drains and sources are connected in parallel respectively and their gates are commonly connected with an output terminal of the invertor 42a. A signal at the output end of the resistor 43g is taken out via the invertors 42c, 42d, and outputted to the counter 5. The N-type MOS transistors 45a, 45b, 45c prevent the voltages between the drains and the sources from being distorted and deteriorated in a rise up characteristic when the aforementioned voltages change from the low logical level to the high logical level. Although the number of stages of the RC integrator is seven in the circuit shown in FIG. 5, the number of the stages can be selected at will in accordance with the width of the desired pulse (the delay time).

In the circuit shown in FIG. 5, since the output signal of the invertor 42b (the output of the one pulse-generating circuit 1) is successively delayed by the RC integrator of the seven stages, the signal broadened to the desired pulse width is outputted from the output end of the resistor 43g. Since the N-type MOS transistors 45a, 45b, 45c, turn on at the time of rise of the input signal, the wave form of the signal can be improved. According to the structure shown in FIG. 5, since the number of the transistors used in the circuit is smaller than that of the delay pluse generator composed of the transistors, the delay pulse having slight dependency on the voltage can be obtained.

[The Third Preferred Embodiment]

Figure 6:
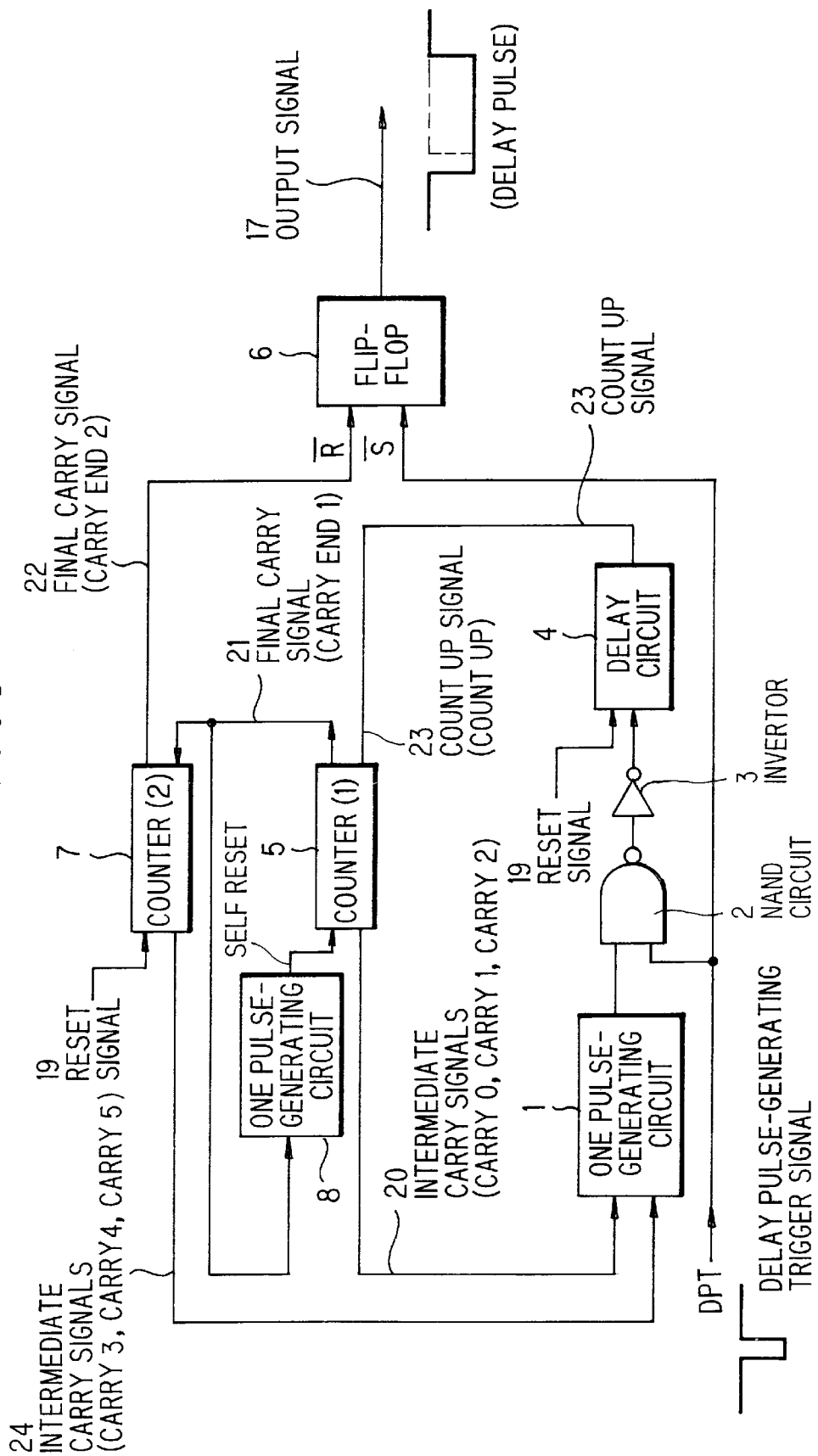
FIG. 6 is a block diagram for showing a structure of a main part of a semiconductor device according to the third preferred embodiment of the invention.

FIG. 6 shows the third preferred embodiment of the invention. Since the structural elements having the same functions are denoted by the same reference numerals in FIGS. 2 and 6, duplicated explanation will be omitted. A feature of this embodiment is that, since a counter is added to the structure shown in FIG. 2, a pluse having a broader width can be generated without increasing the number of the delay elements.

As shown in FIG. 6, the third preferred embodiment is constituted by adding a one pulse-generating circuit 8 and a counter 7 to the circuit shown in FIG. 2. The final carry signal (CARRY END 1) 21 of the counter 5 is inputted to the second counter 7, and the final carry signal (CARRY END 2) 22 of the counter 7 is supplied to the flip-flop 6. Moreover, intermediate carry signals (CARRY 3, 4, 5) 24 are supplied to the one pulse-generating circuit 1 similarly to the intermediate carry signals 20 of the counter 5. The counter 7 is reset by a reset signal 19 supplied from the outside. The counter 5 is reset by the final carry signal 21 outputted from the counter 5, that is to say, the counter 5 is reset by itself.

Figure 7:
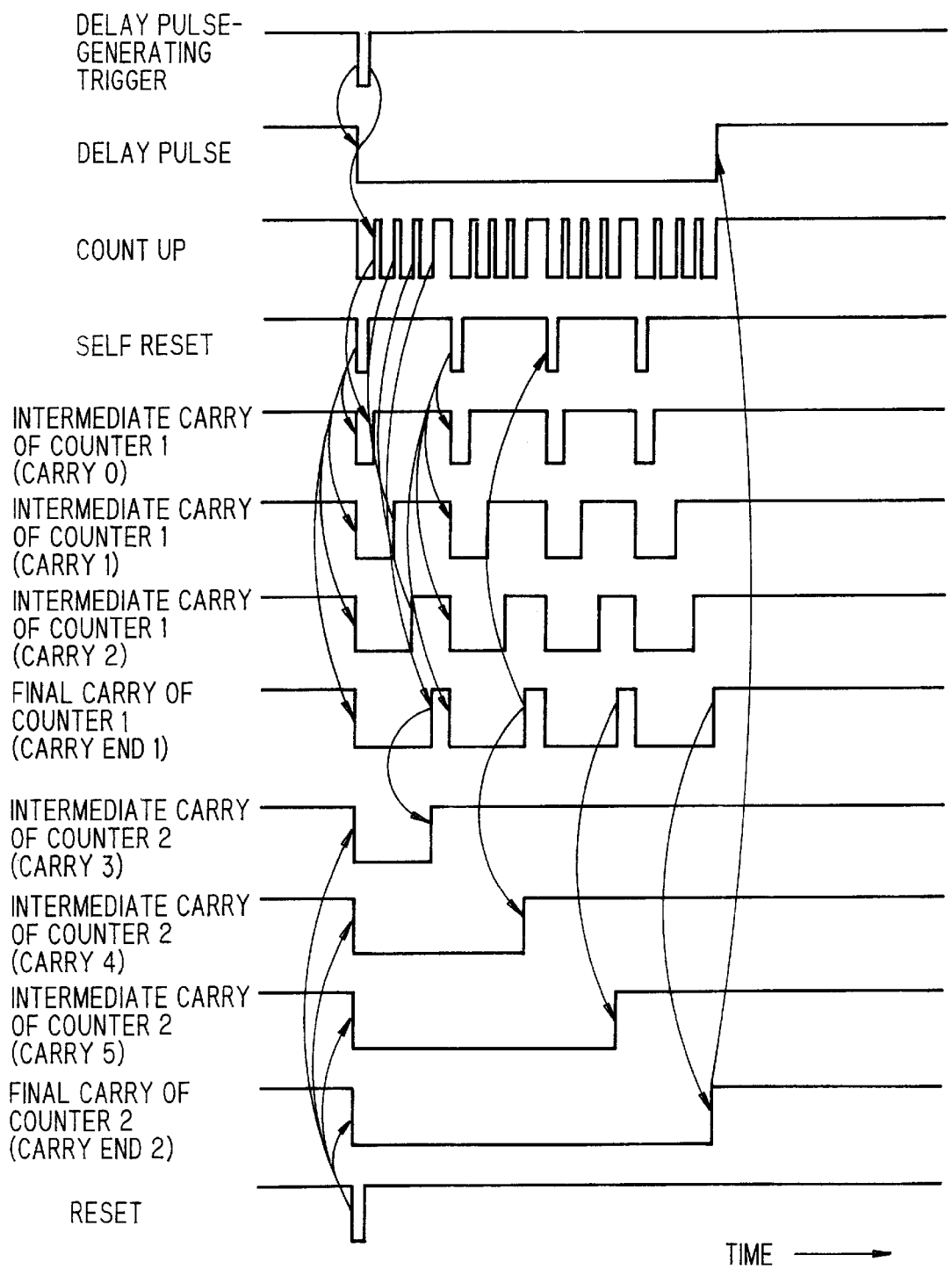
FIG. 7 is a timing chart for showing operations of various parts of a semiconductor device according to the third preferred embodiment of the invention.

FIG. 7 explains the operation of the semiconductor device shown in FIG. 6. The operation of the third preferred embodiment will be explained referring to FIGS. 6, 7.

When the delay pulse-generating trigger signal DPT changes from the high logical level to the low logical level, the flip-flop 6 is set. At the time that the flip-flop 6 is set, the output of the composed pulse (DELAY PLUSE, that is to say, the output signal 17) starts. Moreover, the flip-flop 6 is reset at the time that the final carry signal (CARRY END 2) 22 changes from the low logical level to the high logical level, and the output signal 17 is shut off simultaneously.

When one of the intermediate carry signals (CARRY 0, 1, 2) 20 changes from the low logical level to the high logical level, the one pulse-generating circuit 1 outputs a pulse having a narrow width (a one pulse) The delay circuit 4 operates in accordance with the one pulse signal inputted from the one pulse-generating circuit 1. Explaining concretely, the delay circuit 4 does not delay the input signal when the one pulse signal changes from the high logical level to the low logical level, and delays the input signal when the one pulse signal changes from the low logical level to the high logical level. By the aforementioned process, the delay circuit 4 outputs the count up signal (COUNT UP) 23 having the desired pulse width.

The counter 5 is reset when the reset signal 19 is inputted, and the intermediate carry signals (CARRY 0, 1, 2) 20 and the final carry signal 21 change from the high logical level to the low logical level simultaneously. Thereafter, whenever the count up signal (COUNT UP) 23 is inputted to the counter 5 from the delay circuit 4, the intermediate carry signals (CARRY 0, 1, 2) 20 are successively outputted, and these signals are inputted to the one pulse-generating circuit 1. The final carry signal (CARRY END 1) 21 is generated by the counter 5 at the time that the intermediate carry signals (CARRY 0, 1, 2) 20 change from the high logical level to the low logical level simultaneously. The final carry signal CARRY END 1) 21 is used as a reset signal of the one pulse-generating circuit 8, impressed upon the counter 7, and used as a count signal of the counter 7.

In the counter 7, intermediate carry signals (CARRY 3, 4, 5) 24 are successively generated synchronizing with rises of the final carry signals 21, and supplied to the one pulse-generating circuit 1. Moreover, the final carry signal (CARRY END 2) 22 is generated by the counter 7 simultaneously with COUNT UP thereof, and inputted to the reset terminal of the flip-flop 6. Accordingly, a wide composed pulse (the output signal 17) which extends from the first point of time that the delay pulse-generating trigger signal DPT falls to the second point of time that the final carry signal 22 changes from the low logical level to the high logical level is outputted from the flip-flop 6. As seen from FIG. 7, since the intermediate carry signals (CARRY 3, 4, 5) 24 are generated by the counter 7 in accordance with the final carry signals 21 of the counter 5, a pulse wider than that generated by a single counter can be obtained without increasing the number of the delay elements.

As mentioned in the above, in the semiconductor device according to the invention, since plural pulse signals used as the basic data for setting delay times and a single pulse signal for determining the end of a delay output signal are generated by a counter on the basis of count up signals outputted from a delay circuit, it becomes unnecessary to supply a clock signal from the outside, and restriction imposed on a design is removed. Accordingly, since it becomes unnecessary to increase the number of delay elements used for realizing a desired pulse width, areas of chips are not enlarged.

In the other semiconductor device according to the invention, since the first and second counters are provided, count up signals outputted from the delay circuit are inputted to the first counter, the first counter outputs plural pulse signals corresponding to the first carry signals and pulse signals for counting up the second counter, and the second counter outputs plural pulse signals corresponding to the second carry signals and a single pulse signal for determining the end of a delay output signal, it becomes unnecessary to supply a clock signal from the outside and restriction imposed on a design is removed. Accordingly, since it becomes unnecessary to increase the number of delay elements in order to realize a desired pulse width, areas of chips are not enlarged.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device, comprising:
    a counter which outputs a plurality of successive carry pulse signals in a period starting from an external input one pulse-generating trigger signal, continues for a predetermined time, and generates a final carry signal of said plurality of successive carry pulse signals for determining an end of a delay pulse output signal on a basis of said external input one pulse-generating trigger signal and said final carry signal of said plurality of successive pulse signals, and a delay circuit which outputs a plurality of count up signals to said counter on a basis of said plurality of successive carry pulse signals inputted from said counter and said external input one pulse-generating trigger signal.

2. A semiconductor device according to claim 1, wherein said counter is connected with a flip-flop circuit which generates said delay pulse output signal by being set by said external input one pulse-generating trigger signal and reset by said final carry signal outputted from said counter, and a one pulse-generating circuit which generates a plurality of narrow pulse signals synchronizing with said plurality of successive carry pulse signals outputted from said counter and supplies said plurality of narrow pulse signals to said delay circuit.

3. A semiconductor device according to claim 2, wherein said counter is provided with a plurality of latch circuits connected in series, each of said plurality of latch circuits outputting a corresponding one of said plurality of successive carry pulse signals, respectively, starting from said external input one pulse-generating trigger signal and synchronizing with said plurality of count up signals supplied from said delay circuit, and wherein a number of said plurality of latch circuits is determined depending on a delay time of said delay circuit.

4. A semiconductor device according to claim 1, wherein said delay circuit comprises a plurality of delay elements, each of said plurality of delay elements including one of resistors and transistors.

5. A semiconductor device according to claim 4, wherein said plurality of delay elements including resistors comprises a plurality of resistors which are connected in series and inserted between input and output terminals of said plurality of delay elements, a plurality of capacitative depletion transistors respectively inserted between corresponding output ends of said plurality of resistors and a ground, and a plurality of transistors which are inserted between one or more junction points and a terminal end of said plurality of resistors and said ground, said plurality of transistors turning on/off in accordance with an input signal applied to an input end of said plurality of resistors.

6. A semiconductor device, comprising:

a first counter which outputs a first plurality of successive carry pulse signals in a period starting from an external input one pulse-generating trigger signal, continues for a predetermined time, and generates a first carry end signal of said first plurality of successive carry pulse signals;

a second counter which outputs a second plurality of successive carry pulse signals based on successive inputs of a plurality of first carry end signals and generates a second carry end signal of said second plurality of successive carry signals for determining an end of a delay pulse output signal which is derived from a period of said second carry end signal; and a delay circuit which outputs a plurality of count up signals to said first counter on a basis of input pulse signals corresponding to said first plurality of successive carry pulse signals and said second plurality of successive carry pulse signals, respectively, outputted from said first counter and said second counter and said external input one pulse-generating trigger signal.

7. A semiconductor device according to claim 6, wherein said second counter is connected with a flip-flop circuit which generates said delay pulse output signal by being set by said external input one pulse-generating trigger signal and reset by said second carry end signal outputted from said second counter, and a one pulse-generating circuit which generates a plurality of narrow pulse signals synchronizing with both said first plurality of successive carry pulse signals and said second plurality of successive carry pulse signals, respectively, outputted from said first counter and said second counter and supplies said plurality of narrow pulse signals to said delay circuit.

8. A semiconductor device according to claim 6, wherein said first counter is provided with a first plurality of latch circuits connected in series, each of said first plurality of latch circuits outputting a corresponding one of said first plurality of successive carry pulse signals, respectively, starting from said external input one pulse-generating trigger signal and synchronizing with said plurality of count up signals supplied from said delay circuit, and wherein a number of said first plurality of latch circuits is determined depending on a delay time of said delay circuit.

9. A semiconductor device according to claim 6, wherein said second counter is provided with a second plurality of latch circuits connected in series, each of said second plurality of latch circuits outputting a corresponding one of said second plurality of successive carry pulse signals, respectively, starting from said external input one pulse-generating trigger signal and synchronizing with said first carry end signal supplied from said first counter, and wherein a number of said second plurality of latch circuits is determined depending on a period of said first carry end signal.

10. A semiconductor device according to claim 6, wherein said delay circuit comprises a plurality of delay elements, each of said plurality of delay elements including one of resistors and transistors.

11. A semiconductor device according to claim 10, wherein said plurality of delay elements including resistors comprises a plurality of resistors which are connected in series and inserted between input and output terminals of said plurality of delay elements, a plurality of capacitative depletion transistors respectively inserted between corresponding output ends of said plurality of resistors and a ground, and a plurality of transistors which are inserted between one or more junction points and a terminal end of said plurality of resistors and said ground, said plurality of transistors turning on/off in accordance with an input signal applied to an input end of said plurality of resistors.

12. A semiconductor device including a ring oscillator, comprising:

an invertor located in a circuit path of the ring oscillator;

a delay circuit that receives an output of the invertor, provides a plurality of count up signals, and is located in the circuit path of the ring oscillator;

a counter that counts the plurality of count up signals in a period of time and is located in the circuit path of the ring oscillator, the period of time being determined by an initial delay pulse-generating trigger signal, which is received from outside the device, and a final carry signal, which is provided by the counter and corresponds to a predetermined count, wherein the initial external delay pulse-generating signal and the final carry signal provide timing signals for an outputted delay pulse, which is external to the circuit path of the ring oscillator.

13. A semiconductor device according to claim 12, further comprising:

a flip-flop circuit, external to the circuit path of the ring oscillator, that generates the outputted delay pulse, which is set by the initial external delay pulse-generating trigger signal and reset by the final carry signal; and a one pulse-generating circuit that generates a narrow pulse and is located in the circuit path of the ring oscillator, in which each narrow pulse is transmitted to the invertor and corresponds to each of a plurality of intermediate carry signals outputted by the counter.

14. A semiconductor device according to claim 13, wherein the counter comprises a plurality of latch circuits connected in a series and each one of the plurality of latch circuits provides a corresponding one of the plurality of intermediate carry signals, and wherein a number of the plurality of latch circuits determines a period of time for each of the corresponding plurality of intermediate carry signals.

15. A semiconductor device according to claim 12, wherein the delay member includes a plurality of stages connected in series, each stage comprising a resistor into which a pulse from the invertor is transmitted and an N-type metal oxide semiconductor (NMOS) transistor with a gate connected to an output of the resistor and source/drain connected to ground, such that an RC integrator is formed.

16. A semiconductor device including a ring oscillator, comprising:

an invertor located in a circuit path of the ring oscillator;

a delay circuit that receives an output of the invertor, provides a plurality of count up signals and is located in the circuit path of the ring oscillator;

a first counter that counts the plurality of count up signals in a first period of time and is located in the circuit path of the ring oscillator, the first period of time being determined by an initial external delay pulse-generating trigger signal, which is received from outside the device, and a first carry end signal, which is provided by the first counter and corresponds to a first predetermined count, a second counter that counts a plurality of first carry end signals, is external to the circuit path of the ring oscillator, and provides a second carry end signal that corresponds to a second predetermined count, wherein the initial external delay pulse-generating signal and the second carry end signal provide timing signals for an outputted delay pulse, external to the circuit path of the ring oscillator.

17. A semiconductor device according to claim 16, wherein the second counter is connected to a flip-flop circuit, external to the circuit path of the ring oscillator, that generates the outputted delay pulse, which is set by the initial external delay pulse-generating trigger signal and reset by the second carry end signal, and a one pulse-generating circuit that generates a narrow pulse and is located in the circuit path of the ring oscillator, in which each narrow pulse is transmitted to the invertor and corresponds to each of a first plurality of intermediate carry signals outputted by the first counter and to each of a second plurality of intermediate carry signals outputted by the second counter.

18. A semiconductor device according to claim 16, wherein the first counter comprises a first plurality of latch circuits connected in series and each one of the first plurality of latch circuits provides a corresponding one of the plurality of first intermediate carry signals, and wherein a number of the first plurality of latch circuits determines a period of time for each of the corresponding plurality of first intermediate carry signals.

19. A semiconductor device according to claim 16, wherein the second counter comprises a second plurality of latch circuits connected in series and each one of the second plurality of latch circuits provides a corresponding one of the plurality of second intermediate carry signals, and wherein a number of the second plurality of latch circuits determines a period of time for each of the corresponding plurality of second intermediate signals.

20. A semiconductor device according to claim 16, wherein the delay member includes a plurality of stages connected in series, each stage comprising a resistor into which a pulse from the invertor is transmitted and an N-type metal oxide semiconductor (NMOS) transistor with a gate connected to an output of the resistor and source/drain connected to ground, such that an RC integrator is formed.

* * * * *